US005828681A

United States Patent [19]
Epworth

[11] Patent Number: 5,828,681
[45] Date of Patent: Oct. 27, 1998

[54] WAVELENGTH CONTROL OF DATA-MODULATED LASERS AND METHOD USING SAME

[75] Inventor: Richard Edward Epworth, Herts, Great Britain

[73] Assignee: Northern Telecom Limited, Montreal, Canada

[21] Appl. No.: 836,182

[22] PCT Filed: Mar. 4, 1996

[86] PCT No.: PCT/GB96/00478

§ 371 Date: Apr. 22, 1997

§ 102(e) Date: Apr. 22, 1997

[87] PCT Pub. No.: WO96/27928

PCT Pub. Date: Sep. 12, 1996

[30] Foreign Application Priority Data

Mar. 6, 1995 [GB] United Kingdom .................. 9504432

[51] Int. Cl.[6] ............................. H01S 3/10; H04B 10/04; G02B 6/34
[52] U.S. Cl. ................................. 372/20; 372/18; 372/19; 372/26; 372/31; 372/92; 372/102; 372/50; 359/180; 359/181; 359/188; 359/130; 385/37; 385/42
[58] Field of Search ................................. 372/18, 6, 19, 372/20, 26, 31, 43, 50, 92, 102; 359/180, 181, 188, 116, 130; 385/37, 42

[56] References Cited

U.S. PATENT DOCUMENTS

| 4,786,132 | 11/1988 | Gordon | 385/37 X |
| 5,231,642 | 7/1993 | Scifres et al. | 372/45 |
| 5,335,059 | 8/1994 | Maruyuma et al. | 356/124 |
| 5,337,328 | 8/1994 | Lang et al. | 372/45 |
| 5,500,767 | 3/1996 | Maruyama et al. | 359/642 |
| 5,561,546 | 10/1996 | Esman | 385/2 |
| 5,592,503 | 1/1997 | Welch et al. | 372/50 |
| 5,602,864 | 2/1997 | Welch et al. | 372/50 |
| 5,696,779 | 12/1997 | Welch et al. | 372/18 |
| 5,703,897 | 12/1997 | Welch et al. | 372/50 |

FOREIGN PATENT DOCUMENTS 0 495 559  7/1992  European Pat. Off. ............. 385/37 X

OTHER PUBLICATIONS

"Fibre Bragg Reflector . . . Lasers", Electronics Lett. Jan. 1986, vol. 22, No. 3, pp. 134–135.
"High Power . . . Source" A T and T Publication, pp. 46–48, Mar. 1994.
Japanese Patent Abstratcts, JP8025735, Feb. 1983.
"Transmission Experiments . . . Application", Alcatel publication pp. 68–70, 1987.
"Determination of Power Spectra . . . "Optics Comm. pp. 133–138, Sep. 1988.
"Distributed Feedback Laser . . . ", Applied Phys. Lett., No. 23, pp. 1936–1938, Jun. 1988.
Japanese Patent Abstracts, JP61032488, Feb. 1986.
Japanese Patent Abstracts, JP6152565, May 1994.

*Primary Examiner*—Brian Healy
*Attorney, Agent, or Firm*—Lee, Mann, Smith, McWilliams, Sweeney & Ohlson

[57] ABSTRACT

An optical communications source has a laser optically coupled with an external optical modulator (25). The laser has a long optical cavity and a narrow spectral bandwidth Bragg reflector (24) so that the longitudinal mode separation of the laser emission is small compared with the spectral bandwidth of the reflector. This makes the laser operate multi-mode, but without any significant dispersion penalty.

14 Claims, 4 Drawing Sheets

WAVELENGTH CONTROL OF DATA-MODULATED LASERS AND METHOD USING SAME

BACKGROUND OF THE INVENTION

In optical communications it can be desirable to have strict control over the emission wavelength of an optical transmitter. This is particularly likely to be the case in a wavelength division multiplexed (WDM) system. In such systems the precise control of wavelength allows a reduced wavelength spacing between adjacent channel, and thereby allows a greater number of channels to be accommodated within any particular waveband of, for instance, an erbium doped optical fibre amplifier.

For a reasonably high bandwidth WDM system, the current preferred technology for transmitters is a continuous wave externally modulated distributed feedback (DFB) semiconductor laser. A DFB laser provides significantly better stability than a simple Fabry-Pérot semiconductor laser, but the emission wavelength typically varies significantly from laser chip to laser chip, even though they all be nominally identical. The reason for this is that though it is possible to obtain a relatively tight tolerance over the physical pitch of the grating of a DFB laser, the emission wavelength is determined by the product of this physical pitch with the effective refractive index, and value of this effective refractive index is not only fairly critically dependent upon thicknesses and compositions of the layer structure of the laser chip, but also upon carrier concentration, which in its turn is affected by drive current, temperature and ageing processes that reduce electro-optic conversion efficiency.

In a DFB laser, the wavelength selectivity is provided by a Bragg grating structure but, as discussed in the preceding paragraph, the wavelength control presented by such a grating is complicated by the fact that it is formed in a composite material whose effective refractive index is variable. For quite a number of years researchers have worked with semiconductor lasers which have a reflector external to the semiconductor material that defines one end of the optical cavity of the laser. The additional length of the optical cavity means that the longitudinal modes are at a correspondingly reduced wavelength spacing, thereby affording the prospect of very narrow bandwidth single mode operation. Advantageously such an external reflector is itself spectrally selective. It may be constituted for instance by a Bragg grating in a length of single mode optical fibre. Such an arrangement has been disclosed for instance in U.S. Pat. No. 4,786,132. In this instance, neglecting second order effects the effective refractive index 'seen' by the Bragg grating is constant, and so the spectral reflection characteristic of such a reflector can be stable and well defined.

Semiconductor lasers with external Bragg grating reflectors have been employed in the laboratory to achieve narrow band single mode operation under controlled conditions providing the appropriate stability in the free-space equivalent length of the optical cavity. However, if the equivalent free-space length is allowed to drift, then the wavelength of that mode also drifts in order to keep the equivalent free-space length a constant half-integral number of wavelengths long. If this drifting is allowed to progress far enough, the wavelength change is sufficient to take this mode far enough away from the peak in the spectral reflectivity characteristic of the Bragg reflector for its place to be taken by the adjacent longitudinal mode moving into the wavelength range just vacated by the former mode. Continued drifting in the same direction will eventually cause this adjacent mode to be supplemented by the longitudinal mode adjacent to it, and so on.

The replacement of one longitudinal mode by its successor involves, at best, a sudden change of wavelength, and may also involve a period when the two modes co-exist and beat together. Such effects are most liable to cause large error bursts which would be unacceptable in practical transmission systems. In this context it may be observed that customers typically demand error rates (BER) of between $10^{-12}$ and $10^{-18}$ the latter, in respect of a 10 Gbit/s system, corresponding to an error of less than a single 100 picoseconds error every 3 years.

Changes in equivalent free-space length of the cavity are almost impossible to eliminate in a practical transmission system environment since they are caused by thermal expansion, by mechanical stress and by changes in the effective refractive index of the gain-providing medium. (In the case of a semiconductor laser with an external Bragg reflector this gain medium is the laser chip, but at least in principle the gain medium could take some other form such as a length of erbium doped optical fibre). In theory, one might be able to use some form of feedback control to compensate for these effects and hold the equivalent free-space length to a constant value, but it is believed that no-one has implemented such a feedback system in practice in a high reliability traffic handling transmission system.

In the foregoing analysis, the noise problems arising from mode-hopping have been considered in the context of a WDM transmission system in which narrow bandwidth transmitters are a requirement in order to achieve minimum wavelength separation between adjacent channels. It should be appreciated however that the problem is not specifically a problem of wavelength division multiplexing, but is a problem of narrow waveband transmitters, and that such transmitters also find application in systems that are not wavelength division multiplexed. A narrow waveband transmitter may for instance be required in a single channel system in order to enable high bandwidth operation in the presence of chromatic dispersion. In such a single channel system the absolute value of the emission wavelength of the transmitter is typically of no especial consequence, and so a drift in wavelength might at first be thought to present no problem. However, the accepted way of providing a narrow bandwidth source is to operate a laser in single longitudinal mode, and, as has been shown above, if the equivalent free-space length of such a laser is allowed to drift, then the wavelength of the single longitudinal mode will also drift. Eventually it will drift out of the wavelength band in which it is preferentially excited over all other longitudinal modes, and so its place will be taken by another, thus giving rise to the noise generating mode-hopping problems discussed above.

SUMMARY OF THE INVENTION

The present invention is directed to the construction and operation of narrow band optical transmitters in which the noise generated by mode hopping is much reduced.

According to the present invention there is provided a method of providing a data modulated signal, which signal comprises an optical carrier amplitude modulated with data, wherein the carrier is generated in an optical cavity incorporating a medium providing optical gain, wherein the optical cavity is defined in part by a spectrally selective reflector having a bandwidth that is not more than 0.1 nm wide, and wherein the length of the optical cavity provides a longitudinal mode separation that is sufficiently small compared with the bandwidth of the spectrally selective reflector to provide a carrier for the modulation that is multimode and whose amplitude modulation is small compared with the amplitude modulation imposed by the data modulation.

The invention additionally provides a method of providing a data modulated signal, which signal comprises an optical carrier amplitude modulated with data, wherein the carrier is generated in an optical cavity incorporating a medium providing optical gain, wherein the optical cavity is defined in part by a spectrally selective reflector having a bandwidth that is smaller than the modulated data bandwidth that would be produced by the data modulating a monochromatic source, and wherein the length of the optical cavity provides a longitudinal mode separation that is sufficiently small compared with the bandwidth of the spectrally selective reflector to provide a carrier for the modulation that is multimode and whose amplitude modulation is small compared with the amplitude modulation imposed by the data modulation.

The invention also provides an optical communications transmitter including a laser optically coupled with an external optical modulator, wherein the laser is provided by an optical cavity incorporating a medium providing optical gain, which cavity is defined in part by a spectrally selective reflector, wherein the spectral bandwidth of the reflector is not more than 0.1 nm wide, and the length of the optical cavity provides the cavity with a longitudinal mode separation that is so small compared with the spectral bandwidth of the reflector that, in operation of the laser, a substantial number of longitudinal modes are simultaneously excited.

The invention further provides an optical communications transmitter including a laser optically coupled with an external optical modulator, wherein the laser is provided by an optical cavity incorporating a medium providing optical gain, which cavity is defined in part by a spectrally selective reflector, wherein the spectral bandwidth of the reflector is smaller than the modulated data bandwidth that would be produced by using the optical modulator to modulate a monochromatic source, and the length of the optical cavity provides the cavity with a longitudinal mode separation that is so small compared with the spectral bandwidth of the reflector that, in operation of the laser, a substantial number of longitudinal modes are simultaneously excited.

Whereas previously in the development of narrow bandwidth optical transmitters much effort has been expended upon the stabilisation of single mode operation to prevent the noise problems associated with mode-hopping, the present invention makes a virtue out of multi-mode operation, choosing to regulate the emission bandwidth by the spectral width of a reflector of the laser cavity instead of by the spectral width of a single longitudinal mode of that laser. The centre of the laser emission band is determined by the spectrally selective reflector and, in contrast to the stabilisation of prior art single longitudinal mode semiconductor lasers, here no attempt is made to stabilise the wavelength of any individual mode of the laser. By having a substantial number of longitudinal modes simultaneously excited the noise associated with mode-hopping is much reduced, as also are beat effects.

BRIEF DESCRIPTION OF THE DRAWINGS

There follows a description of narrow bandwidth optical transmitters embodying the invention in preferred forms. The description refers to the accompanying drawings in which.

DETAILED DESCRIPTION OF THE PREFERRED EMBODIMENTS

Figure 1:
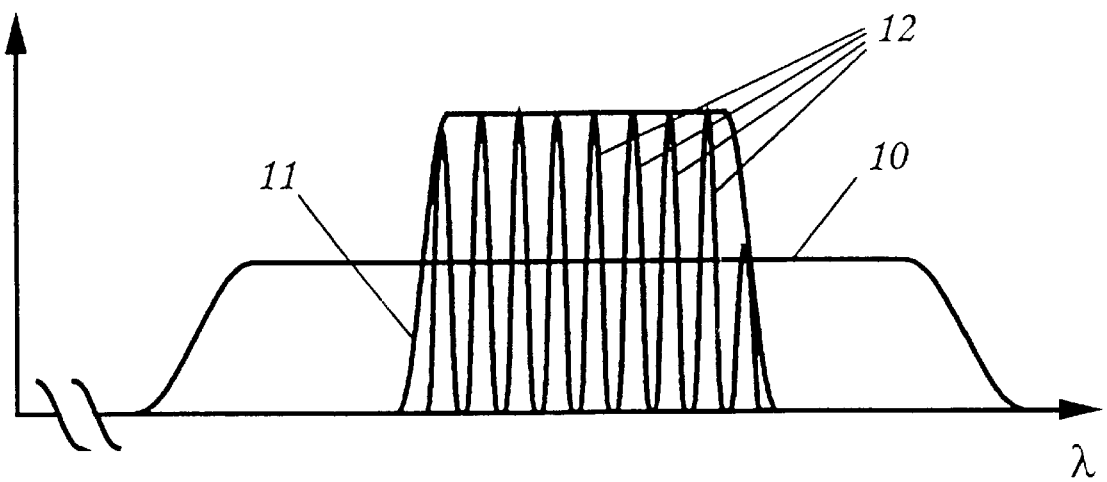
FIG. 1 schematically depicts the spectral relationship between the bandwidths of the laser longitudinal modes, the spectrally selective laser reflector, and the modulation signal.

An optical transmitter according to the present invention comprises an optical modulator fed with continuous wave optical power from a laser. Referring to FIG. 1, the modulator has a certain bandwidth represented by trace 10. The optical power of the laser is confined within a certain spectral band, represented by trace 11, by a spectrally selective reflector that forms a part of the resonant optical cavity of that laser. When that emission is modulated by the modulator the bandwidth of the modulated signal is the bandwidth of the laser emission expanded by an amount determined by the modulation bandwidth, which is why, for illustrative convenience the modulation bandwidth 10 is represented in FIG. 1 as superimposed on the laser emission bandwidth 11 even though the baseband of the modulation is not itself within the optical band. In a high bandwidth transmission system operating in the presence of chromatic dispersion, it is clearly desirable to minimise the bandwidth of the modulated light. For a 10 Gbit/s system, the amplitude modulated (double sideband) optical bandwidth will produce a spectrum containing components spread over at least 10 GHz, and typically, having regard to the rise and fall times of a practical modulator, about twice that amount. For a laser emitting at 1500 nm, 20 GHz corresponds to approximately 0.15 nm, and therefore by constraining this spectral width of the unmodulated laser emission to not more than 0.1 nm makes the dispersion attributable to the unmodulated laser emission smaller than the dispersion attributable to the modulation. Viewed alternatively, dispersion is kept within bounds by ensuring that unmodulated laser emission bandwidth smaller that the bandwidth produced by using the modulator to modulate a monochromatic source. (This implies that the modulated bandwidth is less than twice the minimum possible bandwidth achievable with this modulator). The length of the laser optical cavity is so great in relation to the spectral bandwidth 11 of the reflector that a substantial number of longitudinal modes of the laser cavity lie within the envelope of that spectral bandwidth. These longitudinal modes as represented by trace 12 which for illustrative convenience shows only relatively few modes 12 as lying within the envelope 11, though in practice there will be a more substantial number.

Figure 2:
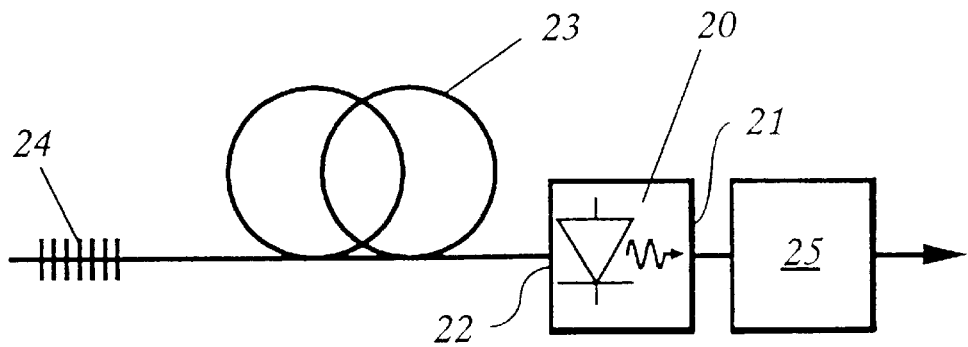
FIGS. 2, 3 4 and 5 depict alternative configurations of laser and modulator.

The optical transmitter of FIG. 2 comprises a laser and an external modulator. The optically amplifying part of the laser is constituted by a semiconductor laser chip 20 having a reflecting end facet 21 and an anti-reflection coated end facet 22, emission through the facet 22 is coupled into a length 23 of single mode fibre at the far end of which is located a spectrally selective Bragg grating reflector 24. This reflector 24 and the reflecting facet 21 of the laser chip 20 together co-operate to define the optical cavity of the laser. The reflecting facet 21 is not a total reflector, and so light transmitted through this facet 21 provides the output of the laser, which is fed to the modulator, which is depicted at 25.

For a 10 Gbit/s modulator 25, the Bragg reflector 24 might typically have a bandwidth of a few GHz while the length of the optical fibre 23 would typically be sufficient to provide at least a hundred longitudinal modes within the envelope of the Bragg reflection band.

Figure 3:
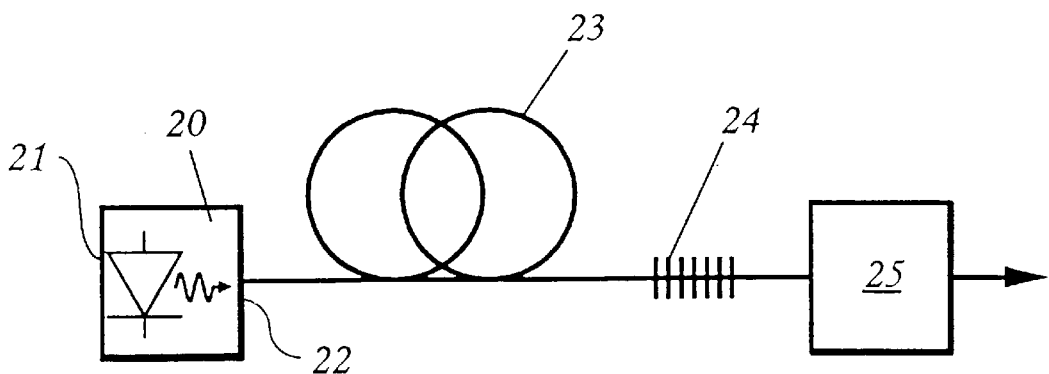

One of the characteristics of the design of the transmitter of FIG. 2 is that optical power is fed to the outside world from both end facets of the laser chip 20. If this is inconvenient, an alternative configuration, as depicted in FIG. 3, may be preferred. This employs almost identical components as the transmitter of FIG. 2, but in this instance the input to the modulator 25 is taken from the Bragg reflector end of the laser optical cavity instead of from the semiconductor laser chip end.

Figure 4:
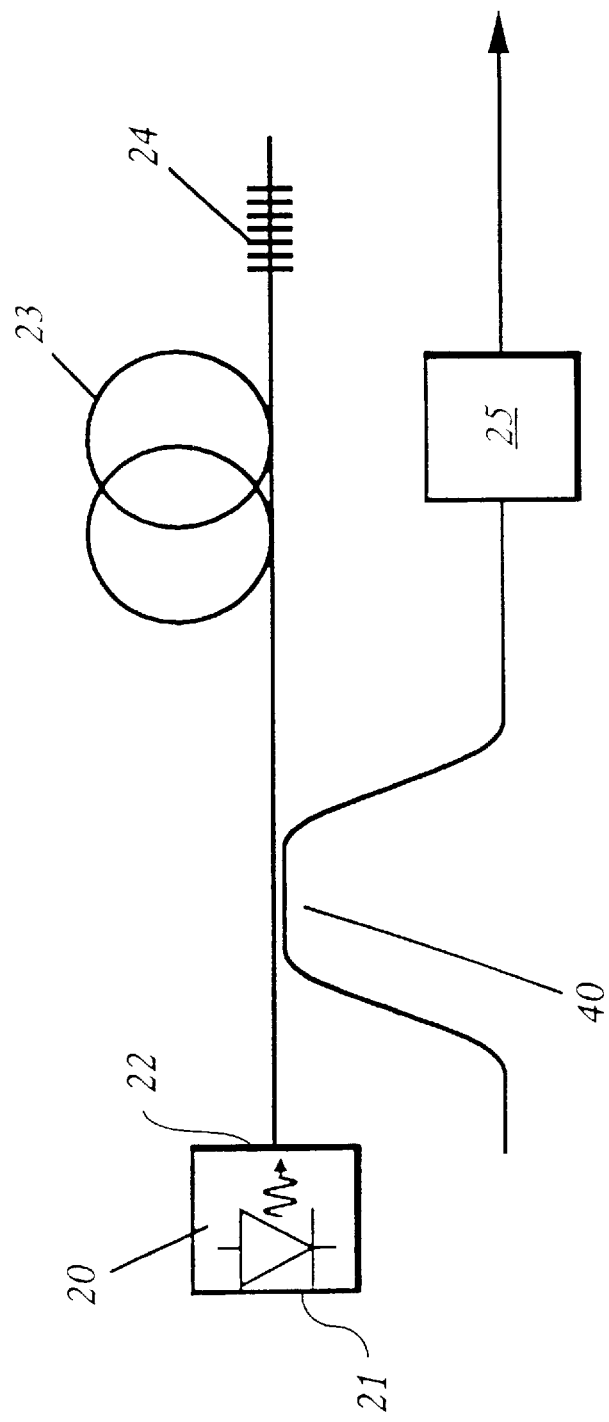

A third variant is depicted in FIG. 4 where the optical cavity of the laser also includes an optical tap 40, for instance constituted by a tapered fused fibre coupler, that taps off a small amount of the power circulating in the laser cavity for feeding to the modulator 25.

If the modulator 25 is polarisation sensitive, it will normally be desirable to provide some means for controlling the state of polarisation (SOP) of the output of the laser that is applied to the modulator. If the optical fibre 23 is ordinary circularly symmetric single mode fibre, then its birefringence is liable to change in the course of time, for instance due to changes in temperature, and also to changes in configuration. Such changes will in their turn produce changes in the SOP of the laser output. One way of overcoming this problem is to use polarisation maintaining fibre for the fibre 23. In the case of the FIG. 4 transmitter polarisation maintaining fibre would also normally be used for the fibre tap connection between the laser and the modulator. The principal axes of the lengths of polarisation maintaining fibre are aligned with the principal axes of the semiconductor laser chip 20 and of the modulator 25.

Figure 5:
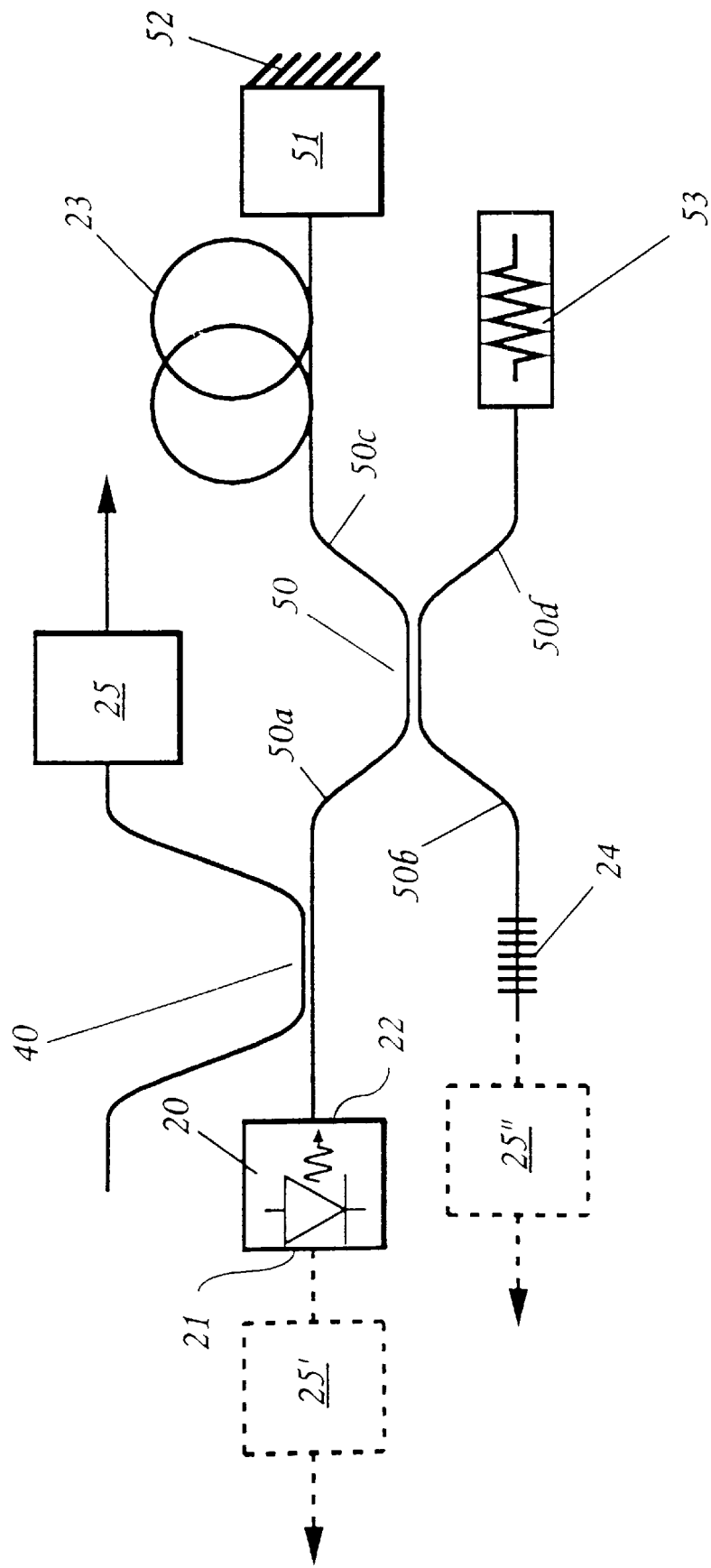

In some circumstances it may be desirable to avoid having to employ a long length of polarisation maintaining fibre extending all the way from the semiconductor laser chip 20 to the Bragg reflector 24. The transmitter of FIG. 5 employs a polarisation beam-splitting coupler 50 and a Faraday mirror, comprising a 45° Faraday rotation element 51 and reflector 52, to avoid this problem. (An example of such a Faraday mirror is marketed by E-TEK Dynamics. Inc. of 1885 Lundy Avenue, San Jose, Calif., CA95131 under the designation HSFM-1550-FC-A.) On one side of the coupling region of the polarisation beam splitting coupler 50, one arm 50a is optically coupled by polarisation maintaining optical fibre to the anti-reflective coated facet 22 of semiconductor laser chip 20, while arm 50b is similarly optically coupled by polarisation maintaining optical fibre to the Bragg reflector 24. On the other side of the coupling region of the polarisation beam splitting coupler, one arm 50c is optically coupled by circularly symmetric single mode fibre 23 with the Faraday rotation element 51, while arm 50d is optically coupled with a non-reflecting attenuator 53. FIG. 5 depicts the modulator 25 as being optically coupled with the laser via a tap 40, and thus the transmitter has a power extraction configuration similar to that of the transmitter of FIG. 4. The modulator can however alternatively be coupled directly to the reflecting facet 21 of the laser chip 20, as depicted in broken outline at 25, to provide a power extraction configuration similar to that of the transmitter of FIG. 2. A further alternative is to couple the modulator to the Bragg reflector 23, as depicted in broken outline 25", to provide a power extraction configuration similar to that of the transmitter of FIG. 2. The principal axes of the lengths of polarisation maintaining fibre are aligned with the principal axes of the semiconductor laser chip 20 and of the modulator 25 (25' or 25").

Light launched from the laser chip 20 into arm 50a of polarisation beam-splitting coupler 50 with an SOP aligned with the principal plane that causes that light to emerge from the coupler by way of port 50c, is then launched into the length 23 of circularly symmetric fibre where its SOP is subject to change in an arbitrary and viable manner in its passage to the far end of that length of fibre. If at this point it were to be reflected without change of SOP, then it would return to arm 50c after being subject to a further change of SOP. In these circumstances the SOP of the light re-entering arm 50c would have an indeterminate SOP subject to arbitrary change. The Faraday reflector does however, in general, impose a change of SOP when it reflects light, and this change is by the amount that ensures that the further change in SOP of the light on the return path through fibre 23 is the change that causes the light to reenter arm 50c with the SOP that is orthogonal to the SOP with which it left arm 50c in the first instance. This means that the returning light reenters arm 50c with the SOP that ensures that it re-emerges by way of arm 50b. From arm 50b it is incident upon Bragg reflector 24, and returns to re-enter arm 50b. The passage of the light from coupler 50 to the Bragg reflector and back again is in polarisation maintaining fibre and so, provided that the Bragg reflector introduces no mode conversion, the returning light re-enters arm 50c with the same SOP as that with which it left arm 50c in the first instance. (If there is any mode conversion, then the mode converted light is directed by the coupler into arm 50d and is launched into non-reflecting attenuator 53). The light reentering arm 50c is therefore launched for a second time into the length 23 of circularly symmetric fibre, but with the SOP that is orthogonal to the SOP with which it was launched the first time. Once again the light is reflected by the Faraday mirror, and so returns to arm 50c with the same SOP as that with which it was launched into the length of fibre for the first time. This light is therefore coupled by coupler 50 to emerge by way of arm 50a. From here it returns to the laser chip 20 so as to complete, after reflection in facet 21, the round-trip path of the laser optical cavity.

If the Bragg reflector 24 of any of the transmitters of FIGS. 2, 3, 4 or 5 is itself constructed in polarisation maintaining fibre then, because the effective refractive indices for the two principal planes are slightly different, the one physical periodicity of grating will provide reflection over one waveband 11 for the fast principal plane, and a slightly displaced waveband 11 for the slow principal plane. By choosing an appropriate value of beat length, the grating can be constructed to reflect one channel of a WDM system when in one orientation, and another channel when rotated through 90°.

Figure 6:
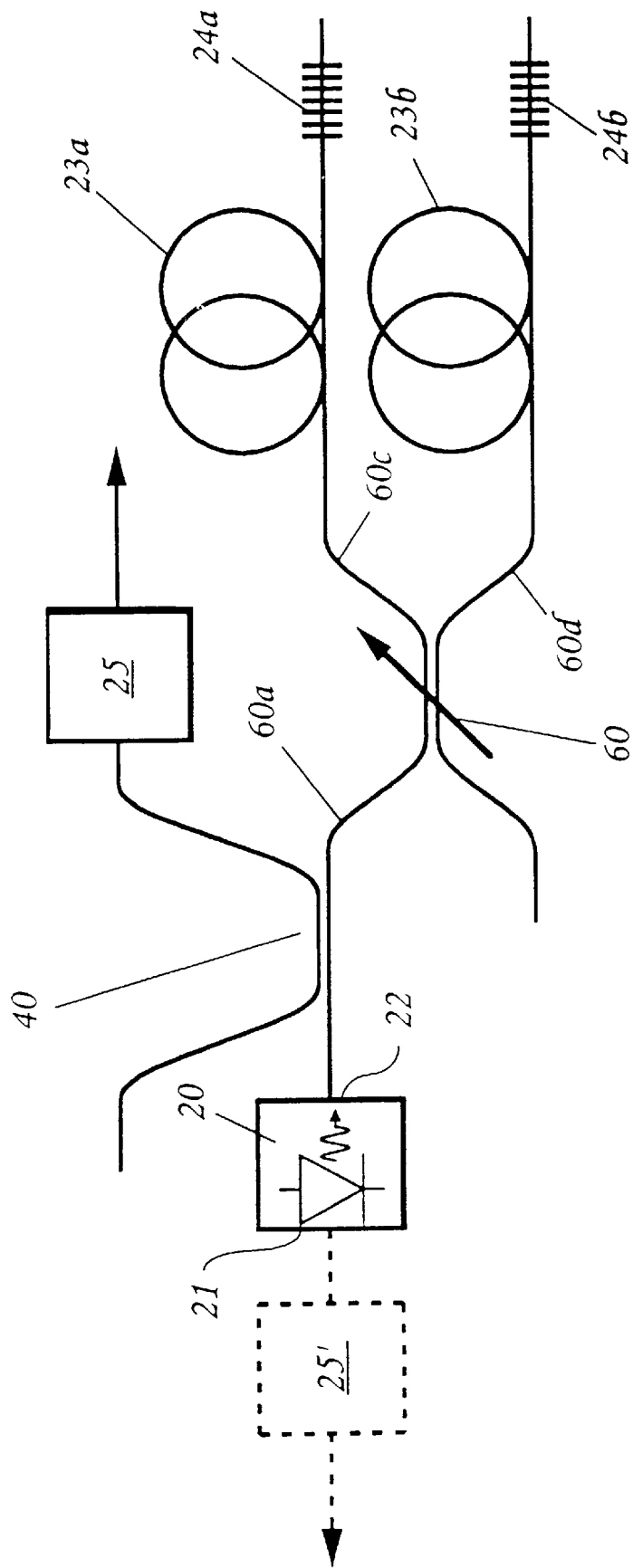
FIG. 6 depicts a configuration of laser and modulator in which the laser is provided with two spectrally selective laser reflectors, and a switch for selecting between these two reflectors.

An alternative form of channel switching is employed in the transmitter of FIG. 6. This is a two-channel version equivalent of the transmitter of FIG. 4 when using the modulator depicted in full outline at 25, and is the two-channel equivalent of the transmitter of FIG. 2 when using instead the modulator depicted in broken outline at 25. It has two lengths 23a and 23b of single mode optical fibre respectively optically coupled with two Bragg reflectors 24a and 24b. The two lengths 23a and 23b of optical fibre are optically coupled with the laser chip 20 by means of a switchable coupler 60. For instance the coupler may be of the type in which an electric field can be applied across the coupler 60 to effect a change of refractive index in its coupling region so as to alter its coupling strength between a first state in which arm 60a is coupled with arm 60c, and a second state in which arm 60a is coupled with arm 60d.

Although each of the specific embodiments described above has been represented as employing a semiconductor laser chip as the optical gain providing element of its laser, it is to be understood that the invention is not limited exclusively to transmitters with lasers employing these particular type of optical gain providing element. It will be apparent for instance that optical gain can alternatively be provided by optical pumping of a length of erbium doped fibre incorporated into the laser structure.

I claim:

1. A method of providing a data modulated signal, which signal comprises an optical carrier amplitude modulated with data, wherein the carrier is generated in an optical cavity incorporating a medium providing optical gain, wherein the optical cavity is defined in part by a spectrally selective reflector having a bandwidth that is not more than 0.1 nm wide, and wherein the length of the optical cavity provides a longitudinal mode separation that is sufficiently small compared with the bandwidth of the spectrally selective reflector to provide a carrier for the modulation that is multimode and whose amplitude modulation is small compared with the amplitude modulation imposed by the data modulation.

2. A method of providing a data modulated signal, which signal comprises an optical carrier amplitude modulated with data, wherein the carrier is generated in an optical cavity incorporating a medium providing optical gain, wherein the optical cavity is defined in part by a spectrally selective reflector having a bandwidth that is smaller than the modulated data bandwidth that would be produced by the data modulating a monochromatic source, and wherein the length of the optical cavity provides a longitudinal mode separation that is sufficiently small compared with the bandwidth of the spectrally selective reflector to provide a carrier for the modulation that is multimode and whose amplitude modulation is small compared with the amplitude modulation imposed by the data modulation.

3. An optical communications transmitter including a laser optically coupled with an external optical modulator, wherein the laser is provided by an optical cavity incorporating a medium providing optical gain, which cavity is defined in part by a spectrally selective reflector, wherein the spectral bandwidth of the reflector is not more than 0.1 nm wide, and the length of the optical cavity provides the cavity with a longitudinal mode separation that is so small compared with the spectral bandwidth of the reflector that, in operation of the laser, a substantial number of longitudinal modes are simultaneously excited.

4. An optical communications transmitter including a laser optically coupled with an external optical modulator, wherein the laser is provided by an optical cavity incorporating a medium providing optical gain, which cavity is defined in part by a spectrally selective reflector, wherein the spectral bandwidth of the reflector is smaller than the modulated data bandwidth that would be produced by using the optical modulator to modulate a monochromatic source, and the length of the optical cavity provides the cavity with a longitudinal mode separation that is so small compared with the spectral bandwidth of the reflector that, in operation of the laser, a substantial number of longitudinal modes are simultaneously excited.

5. A transmitter as claimed in claim 3, wherein the medium providing optical gain is a semiconductor laser chip provided with an anti-reflective coating on one emission facet.

6. A transmitter as claimed in claim 3, wherein the spectrally selective reflector is provided by a Bragg grating formed in single mode optical fibre.

7. A transmitter as claimed in claim 3, wherein the single mode optical fibre is circularly symmetric optical fibre.

8. A transmitter as claimed in claim 3, wherein the single mode optical fibre is polarisation maintaining optical fibre.

9. A wavelength division multiplexed optical transmission system employing a plurality of transmitters as claimed in claim 3.

10. A transmitter as claimed in claim 4, wherein the medium providing optical gain is a semiconductor laser chip provided with an anti-reflective coating on one emission facet.

11. A transmitter as claimed in claim 4, wherein the spectrally selective reflector is provided by a Bragg grating formed in single mode optical fibre.

12. A transmitter as claimed in claim 4, wherein the single mode optical fibre is circularly symmetric optical fibre.

13. A transmitter as claimed in claim 4, wherein the single mode optical fibre is polarisation maintaining optical fibre.

14. A wavelength division multiplexed optical transmission system employing a plurality of transmitters as claimed in claim 4.

* * * * *